United States Patent
Hou et al.

(10) Patent No.: US 7,599,821 B1
(45) Date of Patent: Oct. 6, 2009

(54) MIXED LANGUAGE SIMULATION CYCLE FOR ANALOG MIXED-SIGNAL CIRCUIT DESIGN AND SIMULATION

(75) Inventors: Junwei Hou, Mountain View, CA (US); Craig Winters, Las Cruces, NM (US)

(73) Assignee: Cadence Design Systems, Inc., San Jose, CA (US)

( * ) Notice: Subject to any disclaimer, the term of this patent is extended or adjusted under 35 U.S.C. 154(b) by 328 days.

(21) Appl. No.: 10/836,575

(22) Filed: Apr. 30, 2004

Related U.S. Application Data (60) Provisional application No. 60/467,067, filed on Apr. 30, 2003.

(51) Int. Cl.
*G06F 17/50* (2006.01)
*G06F 13/00* (2006.01)

(52) U.S. Cl. .............................. 703/2; 703/14; 717/135
(58) Field of Classification Search .................. 703/2, 703/14, 22, 4, 17; 716/4, 5; 704/8; 717/135
See application file for complete search history.

(56) References Cited

U.S. PATENT DOCUMENTS

| | | | |
|---|---|---|---|
| 6,560,572 B1 * | 5/2003 | Balaram et al. ............... | 703/22 |
| 6,941,258 B2 * | 9/2005 | Van Heijningen et al. ...... | 703/16 |
| 2002/0049576 A1 * | 4/2002 | Meyer ......................... | 703/14 |
| 2003/0149962 A1 * | 8/2003 | Willis et al. .................. | 717/135 |
| 2003/0154061 A1 * | 8/2003 | Willis ........................... | 703/4 |
| 2006/0074626 A1 * | 4/2006 | Biswas et al. .................. | 704/8 |
| 2006/0241921 A1 * | 10/2006 | Willis ........................... | 703/2 |

OTHER PUBLICATIONS

Agrawal, V.D. et al. "A Mixed-Mode Simulator" *Proceedings of the 17th Conference on Design Automation* (Jun. 1980) pp. 618-625.

Christen, E. and K. Bakalar "VHDL 1076.1—Analog and Mixed-Signal Extensions to VHDL" *Proceedings of the Conference on European Design Automation (EURO-DAC '96 with EURO-VHDL '96)* (Sep. 1996) (6 pgs.).

Cottrell, R. et al. "VHDL Analog Extensions: Process, Issues and Status" *Proceedings of the Conference on European Design Automation* (Nov. 1992) pp. 713-717.

Doboli, A. et al. "A Two-Layer Library-Based Approach to Synthesis of Analog Systems from VHDL-AMS Specifications" *ACM Transactions on Design Automation of Electronic Systems* (Apr. 2004) 9(2):238-271.

Edwards, S. A. "Tutorial: Compiling Concurrent Languages for Sequential Processors" *ACM Transactions on Design Automation of Electronic Systems (TODAES)* (Apr. 2003) 8(2):141-187.

Frey, P. and R. Radhakrishnan "Parallel Mixed-Technology Simulation" *Proceedings of the 14th Workshop on Parallel and Distributed Simulation* (May 2000) pp. 7-14.

(Continued)

*Primary Examiner*—Thai Phan
(74) *Attorney, Agent, or Firm*—Vista IP Law Group, LLP.

(57) ABSTRACT

A method of simulating an analog mixed-signal circuit design using mixed-language descriptions includes initializing a mixed language simulation cycle, processing digital events during delta cycles at a current simulation time of the cycle, and, after the digital events are processed, determining an analog solution at the current simulation time.

30 Claims, 5 Drawing Sheets

OTHER PUBLICATIONS

Kazmierski, T. "A Formal Description of VHDL-AMS Analogue Systems" *Proceedings of the Conference on Design, Automation and Test in Europe* (Feb. 1998) pp. 916-920.

Lathrop, R. H. and R. S. Kirk "An Extensible Object-Oriented Mixed-Mode Functional Simulation System" *Proceedings of the 22nd ACM/IEEE Conference on Design Automation* (Jun. 1985) pp. 630-636.

Liao, S. Y. "Towards a New Standard for System-Level Design" *Proceedings of the 8th International Workshop on Hardware/Software Codesign* (May 2000) pp. 2-6.

Liu, J. and E. A. Lee "A Component-Based Approach to Modeling and Simulating Mixed-Signal and Hybrid Systems" *ACM Transactions on Modeling and Computer Simulation (TOMACS)* (Oct. 2002) 12(4):343-368.

Madrid, N. M. et al. "Analog/Mixed-Signal IP Modeling for Design Reuse" *Proceedings of the Conference on Design, Automation and Test in Europe* (Mar. 2001) pp. 766-767.

Mills, M. and G. Peterson "Hardware/Software Co-Design: VHDL and Ada 95 Code Migration and Integrated Analysis" *Proceedings of the 1998 Annual ACM SIGAda International Conference on Ada* (Nov. 1998) XVIII(6):18-27.

Mir, S. et al., "Towards Design and Validation of Mixed-Technology SOCs" *Proceedings of the 10th Great Lakes Symposium on VLSI* (Mar. 2000) pp. 29-33.

Moser, E. and N. Mittwollen "VHDL-AMS: The Missing Link in System Design—Experiments with Unified Modelling in Automotive Engineering" *Proceedings of the Conference on Design, Automation and Test in Europe* (Feb. 1998) pp. 59-63.

Murayama, T. and Y. Gendai "A Top-Down Mixed-Signal Design Methodology Using a Mixed-Signal Simulator and Analog HDL" *Proceedings of the Conference on European Design Automation (EURO-DAC '96 with EURO-VHDL '96)* (Sep. 1996) (6 pgs).

Nicolescu, G. et al. "Validation in a Component-Based Design Flow for Multicore SoCs" *Proceedings of the 15th International Symposium on System Synthesis (ISSS '02)* Kyoto, Japan (Oct. 2-4, 2002) pp. 162-167.

Overstreet, C. M. and R. E. Nance "A Specification Language to Assist in Analysis of Discrete Event Simulation Models" *Communications of the ACM* (Feb. 1985) 28(2):190-201.

Rumsey, M and J. Sackett "An ASIC Methodology for Mixed Analog-Digital Simulation" *Proceedings of the 26th ACM/IEEE Conference on Design Automation* (Jun. 1989) pp. 618-621.

Shapiro, E. "The Family of Concurrent Logic Programming Languages" *ACM Computing Surveys (CSUR)* (Sep. 1989) 21(3):413-510.

Sommer, R. et al. "From System Specification To Layout: Seamless Top-Down Design Methods for Analog and Mixed-Signal Applications" *Proceedings of the Conference on Design, Automation and Test in Europe* (Mar. 2002), 7 pgs.

Wolff, F.G. et al., "Using Codesign Techniques to Support Analog Functionality" *Proceedings of the 7th International Workshop on Hardware/Software Codesign* (Mar. 1999) pp. 79-83.

\* cited by examiner

MIXED LANGUAGE SIMULATION CYCLE FOR ANALOG MIXED-SIGNAL CIRCUIT DESIGN AND SIMULATION

CROSS-REFERENCE TO RELATED APPLICATIONS

The present application claims the benefit of U.S. Provisional Application No. 60/467,067, filed on Apr. 30, 2003, which is hereby incorporated by reference in its entirety.

FIELD OF THE INVENTION

The invention is related to the field of analog and mixed-signal (AMS) circuit design and simulation.

BACKGROUND OF THE INVENTION

A Verilog-AMS description of a mixed-signal circuit design includes semantics of initialization and time-sweep phases of a transient analysis for a simulation cycle of the circuit design. A VHDL-AMS description of the mixed-signal circuit provides a conceptual representation of a simulation cycle for the relative sequencing of analog execution, digital signal updates, digital process execution, postponed process execution, DOMAIN signal changes, initialization, delta cycle behavior, and BREAK set processing.

The differences in the representation of a simulation cycle may prevent the two languages from being used together in a simulation. For example, in a simulation cycle, the relative sequencing of processes performed in VHDL may not be synchronized with the phases of the analysis which are performed in Verilog, because VHDL processes analog to digital events during a BREAK, while Verilog does not BREAK a digital simulation in response to an analog to digital event.

Therefore, the simulation performance and accuracy for the mixed-signal circuit may be adversely affected by the differences in the two languages.

SUMMARY OF THE INVENTION

A method of simulating a mixed language electronic circuit design includes representing a first portion of an analog mixed signal (AMS) circuit design in a first language, representing a second portion of the AMS circuit design in a second language, and executing a simulation of the mixed language AMS circuit design using the first and second language representations in a single simulator during a single simulation cycle.

DETAILED DESCRIPTION

A mixed language simulation cycle performs a simulation of an analog mixed-signal circuit design. In one embodiment, the method of simulating a mixed language electronic circuit design includes representing a first portion of an analog mixed signal (AMS) circuit design in a first language, representing a second portion of the AMS circuit design in a second language; and executing a simulation of the mixed language AMS circuit design using the first and second language representations in a single simulator during a single simulation cycle. The first language may be Verilog-AMS and the second language may be VHDL-AMS, for example.

The simulation cycle may be executed by synchronizing analog and digital events from the first language representation with analog and digital events from the second language representation during the simulation cycle. Synchronizing the analog and digital events may include processing a first set of digital events during a first delta cycle at a current simulation time of the simulation cycle, processing a second set of digital events during a second delta cycle at the current simulation time, and processing a set of digital to analog events between the first and second delta cycles. For example, a digital to analog event can be processed between the first and second delta cycles by determining that a VHDL break statement has executed during the first delta cycle and determining an analog solution incorporating the set of digital to analog events before processing the second delta cycle. After a last analog solution at current simulation time is determined, the method can process postponed processes.

To process the analog event, a speculative analog solution may be determined for a future simulation time. The speculative solution may be rejected if a digital to analog event occurs at a simulation time earlier than the future simulation time of the speculative solution. During initialization, the process may initialize simulation elements of first language representation of the mixed language AMS circuit design with simulation elements of second language representation of the mixed language AMS circuit design. The initialization may also include setting an implicit break flag to set the time of the first simulation cycle to zero.

The Mixed Language Simulation Cycle (MLSC) method includes a synchronization process to support VHDL, Verilog, or a combination of both VHDL and Verilog mixed language simulations. For example, BREAK statements executed during a simulation cycle by VHDL are synchronized with the Verilog statements. In one embodiment of the MLSC process, the simulation results for a VHDL circuit complies with the VHDL-AMS (Analog Mixed-Signal)-LRM (Language Reference Manual), and the simulation results for a Verilog circuit complies with the Verilog-AMS-LRM.

For example, the VHDL-AMS LRM states that both digital and analog simulation engines are run in parallel for each simulation time that the simulator is scheduled to run. However, the MLSC process for the simulation cycle can postpone the run of the analog engine until the digital events, including delta events, are processed at a given simulation time. By postponing the analog engine, unnecessary and expensive runs of analog engine may be avoided, while the simulation accuracy is maintained.

A general exception may occur when the VHDL-AMS break flag is set, because the break flag indicates an analog dependency on a digital event. The break flag can be set when a VHDL-AMS break statement is triggered or when the simulation is at the initialization phase. In that case, the analog and digital engines are run in parallel to capture certain behavior of the system under simulation.

The MLSC may increase the performance of the AMS simulation with the mixed-signal simulation synchronization process. The MLSC uses Verilog-AMS heuristics for allowing the analog engine to take a speculative solution with a time-step that is larger than the digital next event time. For example, the analog engine can take a larger time step using analog accuracy constraints (such as local truncation error (LTE) and device evaluation constraints, for example) for the speculative solution. This Verilog-based approach also complies with the simulation accuracy of the VHDL-AMS LRM. Therefore, with MLSC, the analog engine can take fewer time-steps than what is implied by the VHDL-AMS LRM.

In the MLSC process, there may be at most one speculative solution at any simulation time. In the case of a digital-to-analog (D/A) event occurring before the analog speculative solution time, the speculative solution may be rejected. A new analog solution at the D/A time may actually be solved (using numerical integration methods, for example) instead of interpolated. This ensures the simulation accuracy and stabilities which are important in simulating system discontinuities often seen in VHDL-AMS descriptions. The simulation performance penalty of rejected speculative solutions may be less than 5%. In certain cases this may avoid very small time-steps caused by simulation stability problems (such as non-convergence and device evaluation inconsistency, for example) because of the interpolated solutions, and therefore may improve the overall simulation performance.

The MLSC also uses break recovery steps to improve the simulation performance. In VHDL-AMS, a break statement is executed when a discontinuity is encountered in an analog signal. After a break is executed, the analog step-size proposed for the following recovery step is determined by the weighted average of prior successful break recovery steps. This method avoids both a long series of size-doubling steps to grow a small initial step size to an appropriate value, and it also avoids large errors that can be incurred when the pre-break step size is assumed to be valid following a discontinuity.

Overview of Synchronizing an MLSC Process

Figure 1:
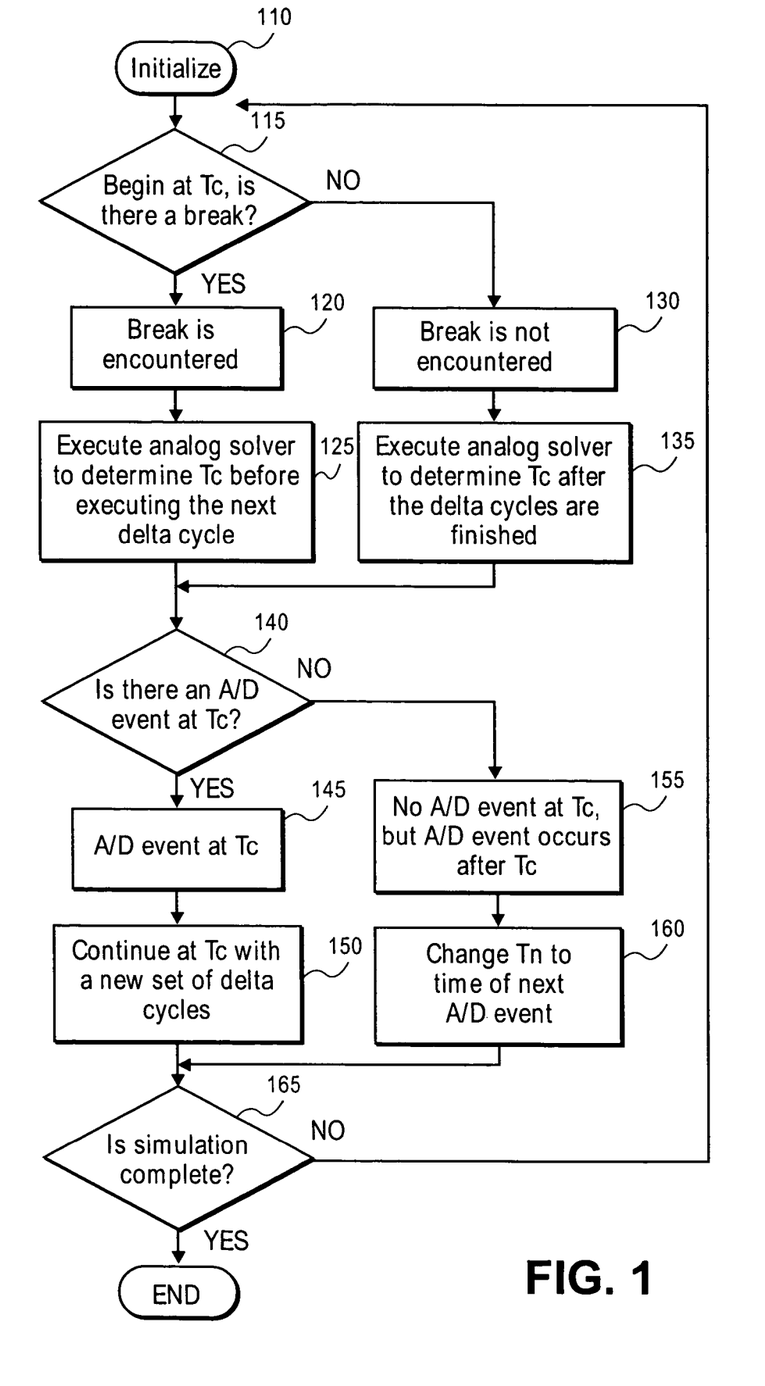
FIG. 1 shows an example of the general behavior of the mixed language simulation cycle (MLSC) process.

An example of the general behavior of the mixed language simulation cycle process is shown in FIG. 1. In the initialization phases of the MLSC process 110, an implicit BREAK is applied before the simulation begins. This allows the digital processes to be executed without knowing the results of each other, and the analog solver to be called to determine a solution without knowing the results from the digital processes. Then, after the signals are updated (realized and seen between processes), the simulation begins to execute simulation cycles, starting with a current simulation cycle at a current time, Tc, 115.

Figure 2:
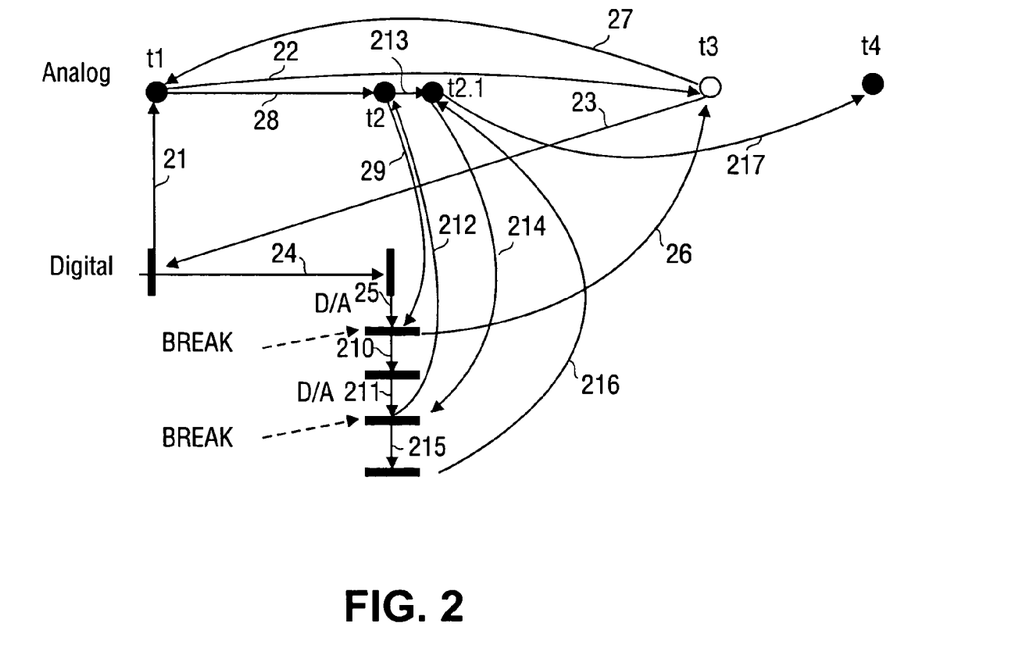
FIG. 2 shows an example of a synchronization process, or loop, to synchronize the analog and digital engines when a BREAK occurs in VHDL.

During the current simulation time Tc, a VHDL BREAK statement may be encountered, 120. If there is a BREAK in the current delta cycle of the simulation of a mixed language circuit, the analog solver is executed at the beginning of the next delta cycle, 125, to determine the analog solution for Tc. For example, a synchronization process may be performed to synchronize the mixed languages during the simulation cycle, as shown in FIG. 2 and discussed below. The synchronization process synchronizes the digital and analog engines when the BREAK occurs.

If no BREAK is encountered during the current simulation time Tc, 130, the analog solver is called, 135, to determine the analog solution for Tc, and the process continues to 140. The analog solver may be called after the delta cycles of simulation time Tc are performed by the digital engine, but before postponed processes are performed. This allows the digital variables and signals to be updated before the analog solver is run.

At 140, the analog solution determined for Tc may generate an A/D event at Tc, or at a simulation time later than Tc. If the analog solution triggers an A/D event at Tc, 145, more events (and delta cycles) at Tc may be created and the method continues to process the A/D event, 150, before the VHDL postponed processes are executed.

If the analog solution does not trigger an A/D event at Tc, but an A/D event occurs after Tc, 155, the analog solver advances the analog time Ta until Ta is larger than or equal to Tn. As the analog time advances, an A/D event may be triggered at a time later than Tc. If so, then the next analog event time Tn is changed to the time of this next A/D event, 160. If the simulation is finished at 165, the process ends. If additional simulation cycles are to be performed, the process returns to 115 and executes the next simulation cycle.

The Synchronization Process for BREAK Statements

FIG. 1 shows a synchronization process 125 to synchronize the Verilog and VHDL processes in an MLSC simulation when a BREAK occurs. In VHDL, the BREAK flag is set if there is a D/A event created from a VHDL process. FIG. 2 shows an example of a synchronization process, or loop, to synchronize the analog and digital engines when a BREAK occurs in VHDL. This example of a simulation synchronization process includes processing digital delta cycles and D/A events.

The Digital engine calls the Analog engine (21), and the Analog engine determines a speculative solution for time t3 (22). After the Analog engine determines the speculative solution during its transient analysis, it sends state information to the Digital engine (23). The Digital engine begins to run using its own time steps (24). The Digital engine may run through several delta cycles (25, 210, 211, 215) when the current time Tc is t2. If the Digital engine produces D/A events in a delta cycle (25), the control of the simulation is passed to the Analog engine at the beginning of the next delta cycle (26).

The analog engine returns to the point at which the digital engine last surrendered control (27). The Analog engine recalculates the analog solution up to the time when the D/A event occurred at t2 (28). The Analog engine then returns control to the digital engine, which performs the next delta cycles (29, 210). If the Digital engine produces another set of D/A events in a delta cycle (211), the control of the simulation is passed to the Analog engine again at the beginning of the next delta cycle (212). Since the analog already has a solution at t2, it takes a time-step (t2.1), which is small enough to be inside the digital resolution, but large enough that the step size is finite within the resolution of the analog engine (213).

The Analog engine returns control of the simulation to the digital engine, which executes the next delta cycles (214). The current time Tc remains at t2 for the digital performance. After the delta cycles are exhausted at Tc (215), the control of the simulation is passed back to the Analog engine (216). The analog engine returns to the last simulation time point and takes the next time step (217) to t3.

In this example, which shows a simulation using MLSC, the analog solver is called between delta cycles if the BREAK flag is set by VHDL statements. The D/A events triggered at different delta cycles can therefore be distinguished by the analog solver. To select the time-step (t2.1) for the BREAK (212), a break recovery method may be used, to improve the performance of the simulation. During the break recovery method, the Break flag is set to indicate pending analog signal discontinuities. When the analog solver determines an analog solution, it calculates new discontinuous values for the analog signals. Then Ta is advanced to compute the next analog time-step (213). This is called the recovery time-step, and the amount by which the analog time point Ta is advanced is determined during the recovery process. On the first break execution (212), the step-size (t2.1) is set to the step-size before the break. The analog solver may adjust the initial step-size before determining the final analog time (Ta) value for the recovery time-step, in order to meet error constraints. The final step-size that is selected is stored as the recovery step-size.

On subsequent break executions, the recovery step-size is used for the initial step size of the recovery time-step. Again, the analog solver may adjust that size due to error constraints. The value maintained in the recovery step-size storage location is the accumulated weighted average of the final (analog solver determined) step-size of the recovery time-step. The recovery process is therefore able to select a step-size that has a high probability of success without being adjusted by the analog solver, as the adjustment cycles are computationally expensive.

The Synchronization Process Without BREAK Statements

Figure 3:
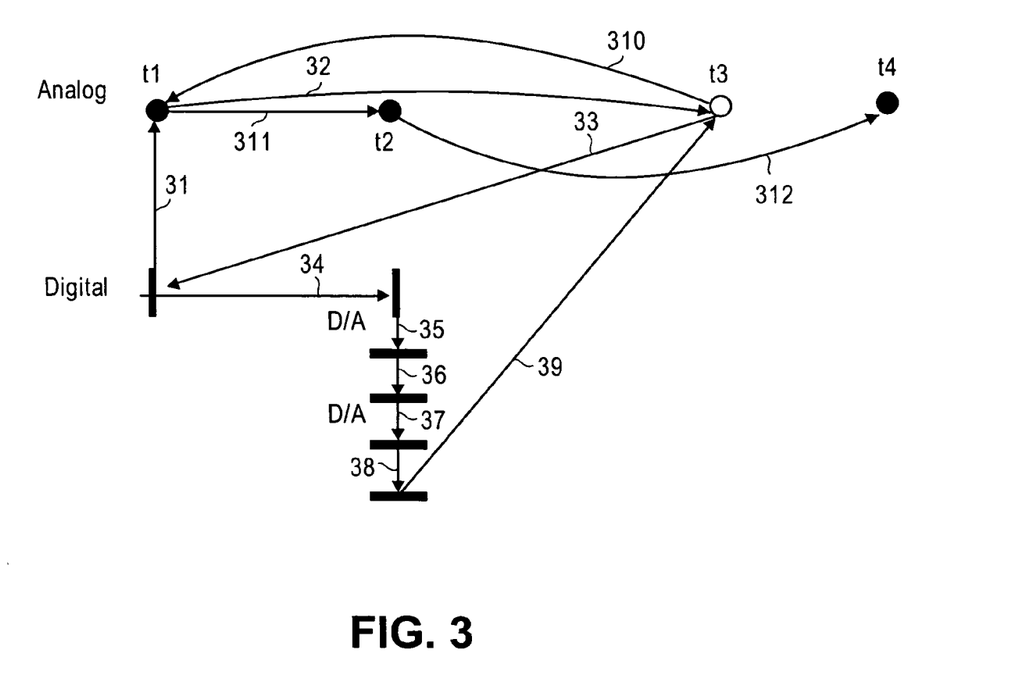
FIG. 3 shows an example of a synchronization process without a BREAK flag from a VHDL method.

The synchronization loop between analog and digital engines in an MLSC synchronization method 135, as shown in FIG. 1, that is performed if there is no BREAK flag from a VHDL process, or if VHDL descriptions are not used in the simulation, is shown in FIG. 3. In this example, the synchronization method includes digital delta cycles and D/A events.

The Digital engine, at time t1, calls the Analog engine (31), which begins the transient analysis for the next Analog time t3 (32) and sends the resulting state information to the Digital engine (33). The Digital engine begins to run using its own time steps (34). The Digital engine may run through several delta cycles when the current time Tc is t2. If the Digital engine produces D/A events during the delta cycles, the digital simulation continues until the delta cycles are exhausted (35, 36, 37, 38). Then the control of the simulation is returned to the Analog engine (39).

The analog engine returns from t3 to the point at which the digital engine last surrendered control, t1 (310). The Analog engine recalculates the analog solution up to the time t2 when the D/A event occurred (311). The Analog engine then takes the next time step to t4 (312). The analog solution at t2 (when the D/A event occurred) and the speculative analog solution at t3, may be accurate solutions determined with a numerical integration method, to eliminate simulation stability issues.

A Mixed Language Simulation Cycle with Verilog VHDL Synchronization.

Figure 4:
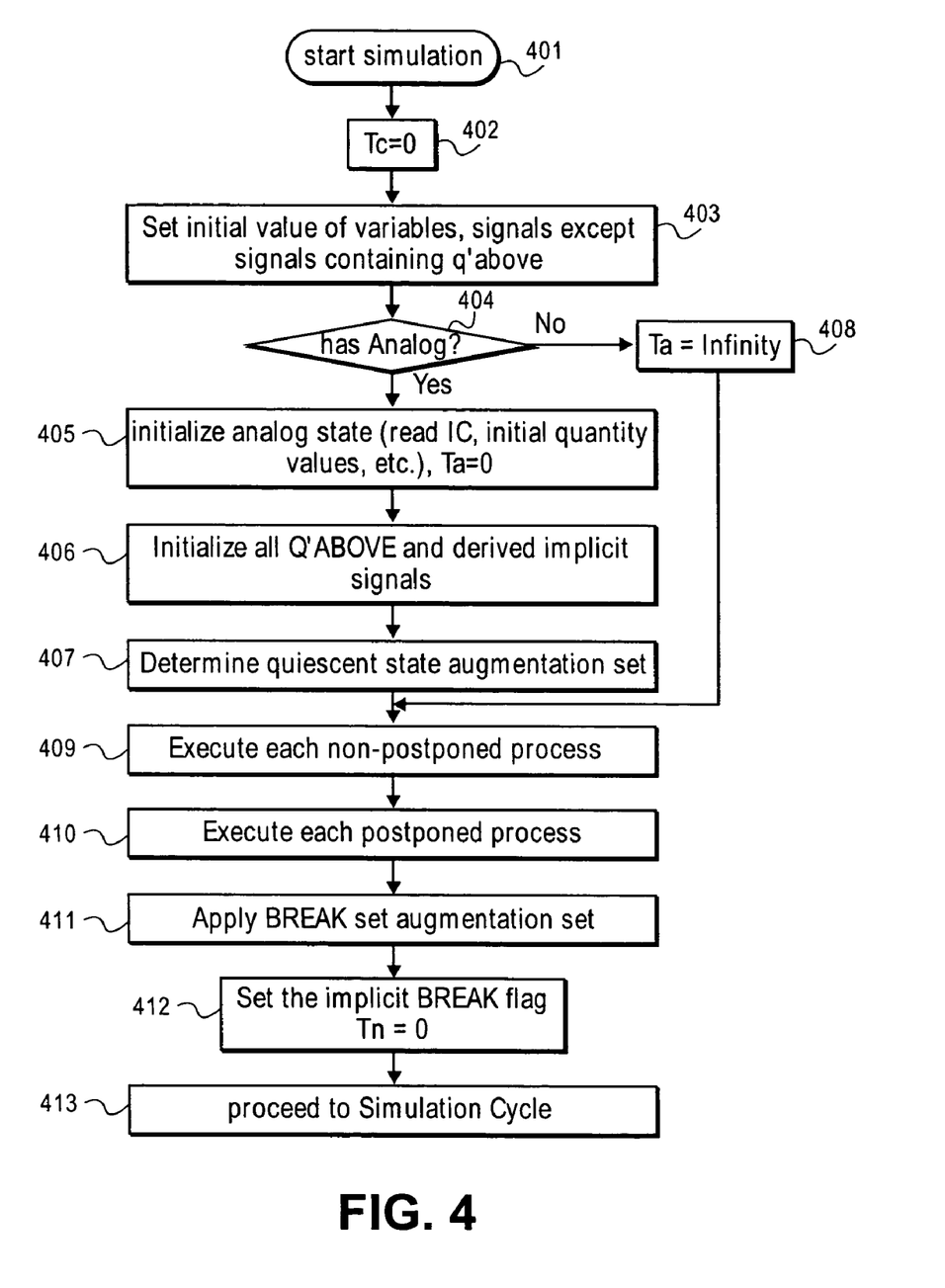
FIG. 4 shows an example of an initialization process for the MLSC process.
Figure 5:
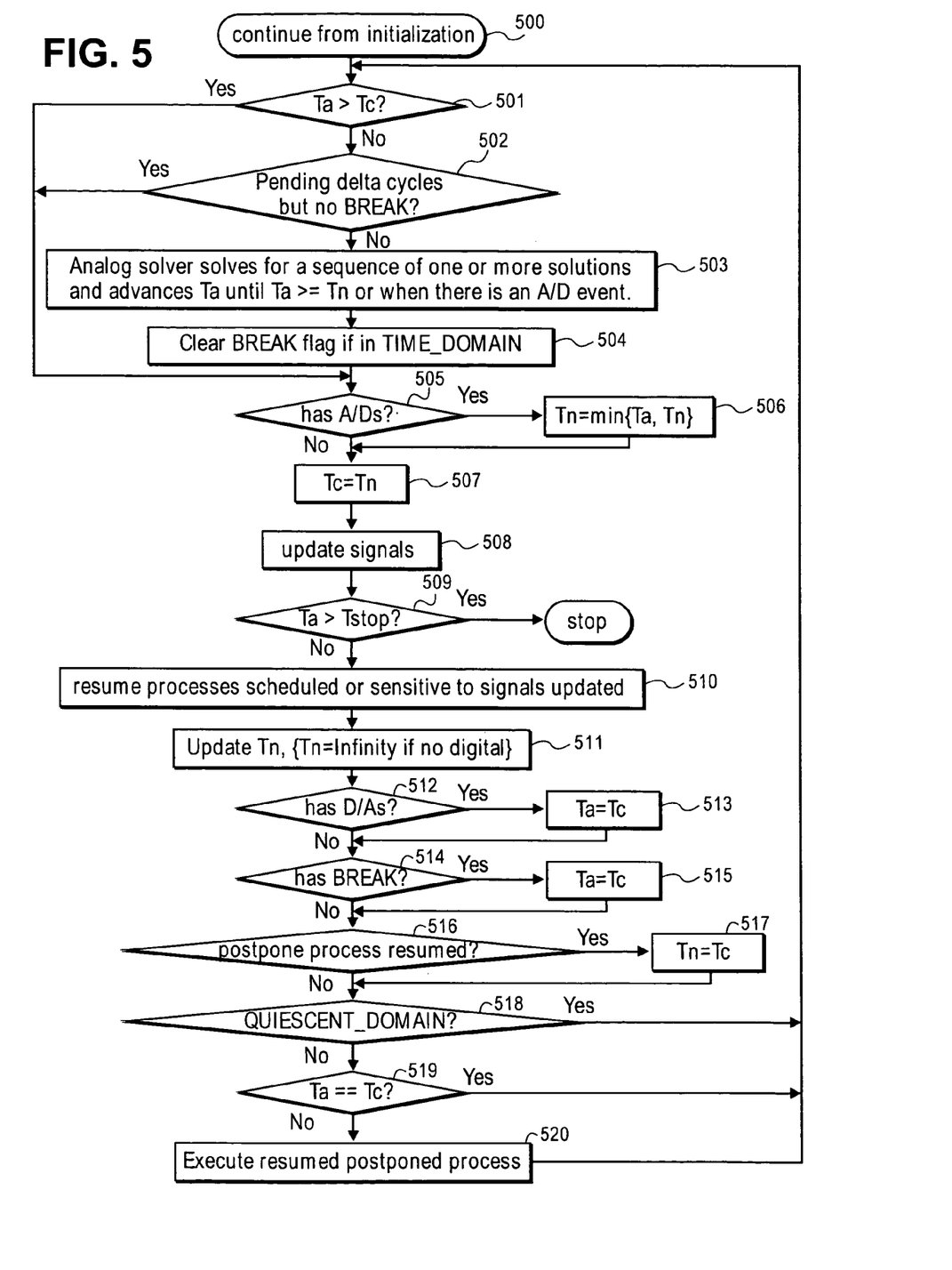
FIG. 5 shows another example of an MLSC process with synchronization.

The mixed-language simulation cycle of FIG. 1 includes an initialization method as shown in FIG. 4, and a simulation method as shown in FIG. 5. A simulation cycle is a simulation unit in which all due processes are executed in parallel. The following times, Tc, Tn, and Ta, are used in the description of the initialization and simulation processes.

Tc is the current simulation time at which the simulator updates signal state for the circuit under simulation and computes new events that need to be scheduled in future time or delta cycle. Tc may increase monotonically. To the user's perspective, Tc is displayed in the AMS Simulator graphical user interface (GUI) window.

Tn is the earliest next event time at which the simulator has scheduled digital events for the circuit under simulation. It is an upper bound, or called analog objective time in Eureka, for the advancement of the analog solver. Tn can decrease when new events need to be scheduled earlier as a result of the current time simulation.

Ta is the analog engine's latest solution time. When the analog solver is run, it computes the time steps based on its accuracy constraints. The analog solver is allowed to go one step beyond Tn, which means Ta can be larger than Tn if the previous analog time before Ta is less than Tn. The last analog solution at Ta is speculative and can be rejected by a new D/A event earlier than Ta. This solution time may also be called the synchronization time, the time snare or the cow-pie time. Ta may not be defined in VHDL-AMS.

The Initialization Process

An example of the initialization process 110 of FIG. 1 is shown in FIG. 4. The simulation starting point is found, 401. (This may not imply a DC solution). The current simulation time, Tc, is set to 0.0, 402. (Tc is the current discrete simulation time). The initial values of the signals and variables (except signals containing q'above), are set, 403. In VHDL, this sets declared objects to the value in the object declaration or its default. Implicit objects are set to initial values as described in the VHDL-LRM. In Verilog modules, the real (wreal) variables are set to default of 0; the analog integer variables are set to default 0; and the digital integer variables, regs, and wires are set to X.

If no analog modules are in the design, 404, the analog time is set to infinity, 408, and the process continues at 409. If analog modules are in the design, 404, analog initial state values (such as read IC and initial quantity values, for example), are setup, 405. The Q'ABOVE and derived implicit signals are initialized, 406. A quiescent state augmentation set is determined, 407. The analog time, Ta, is set to zero. The initial conditions and nodesets are read for the spectre modules. The spectre equivalent of the quiescent state augmentation set is the separation of static and dynamic matrices, the static being the quiescent state expressions, and the dynamic being the time domain expressions. The quiescent state augmentation set may be used in finding the DC solution.

Each non-postponed process is executed, 409. A non-postponed process is a process that is executed in a simulation cycle due to schedule or updated signals on which the process is sensitive. A non-postponed process may be either a Verilog concurrent process or a VHDL non-postponed process. Running a non-postponed process can schedule future events on signals. The future events can update signal values when the scheduled time is reached, at which time processes sensitive to events on the signals are resumed. Events with zero delay may be scheduled, but they also wait until the next delta cycle to update signal values. These zero delay events are called delta events.

Each postponed process is executed, 410. A postponed process is a VHDL process that is the last to be executed at any point in time, and is prohibited from scheduling delta events. Postponed processes run after the delta events are processed.

A BREAK set is applied to the augmentation set, 411. The BREAKs with BREAK-lists are executed. These BREAK statements are preserved throughout the QUIESCENT_DOMAIN simulation.

The implicit BREAK flag is set, and the time of the next (first) simulation cycle, Tn, is set to 0.0, 412. The simulation starts with the next time of a digital event, Tn, equal to the current time Tc. In other words, the simulation starts with a delta cycle. This condition may be caused by a scheduled delta event, or may be forced, as in this case, by setting Tn to Tc. The simulation cycle is entered, 413.

There may be cases when the analog solver fails under the default initial digital values. In MLSC, the convergence property can be improved if this occurs. The first call to the analog solver may see the digital initial X/Z values, which are then converted to 0 by connection modules. The circuits may have better convergence properties when the input is 0. If the analog solver does not converge in the first DC analysis, it returns to digital with warning messages. In the second call to the analog solver, the analog solver will solve for DC again, with the digital results. In the first TCL command, the user can enter "run-sync" to let the analog solver complete the first solution at DC. If the warning message is given for convergence difficulties, the user can use tel force/deposit to assist the second DC solution.

With or without BREAK flag, if Tn is 0, the analog solver solves for DC solutions and remains in QUIESCENT_DOMAIN when returning to digital. If there is no analog module in the design, Ta is set to infinity during initialization. There is no time-step to be set for the simulation, and so the analog solver will not be called. If there is no digital module in the design, the next event time Tn will be updated to infinity, since there is no digital events in the queue. Therefore, the analog solver will run until its stop time.

The MLSC Simulation Process.

An example of a method to perform a Multi-Language Simulation Cycle is shown in FIG. 5. This simulation loop executes discrete activities at discrete times and uses the analog solver to advance time to the next discrete activity, as shown in FIGS. 1, 2, and 3, following the initialization process of FIG. 4.

As shown in FIG. 5, if the current time Tc is less than the time of the next analog event Ta, 501, or if the next cycle is a delta cycle but no BREAK is set, 502, the process continues at 505. Using the analog solver to calculate an analog solution may be skipped if the current time is less than Ta. This is because the analog solver already has a speculative solution, or more digital delta cycles are pending at Tc, but no BREAK is set. In one embodiment, these checks 501, 502 may be performed by setting a time snare event at Ta in the digital event queue. The analog solver (in next step) is called when the current event is a time snare.

The analog solver is executed, 503. The analog solver solves for a sequence of one or more solutions and advances Ta until either Ta is greater than or equal to Tn, or until an analog to digital (A/D) event occurs. An A/D event can be either a VHDL A/D event where Q'ABOVE(E) becomes contradictory, or a Verilog A/D event triggered by @cross or @above.

If there is no A/D event, the analog solver solves for a sequence of solutions and advances Ta until Ta is greater than or equal to Tn. The last solution at Ta is a speculative solution, while the analog solution time before Ta is less than Tn. The analog solutions before Ta are accepted and may not change. The QUIESCENT_DOMAIN is the simulator state at time 0.0, which determines the initial DC operation point of the circuit. The TIME_DOMAIN is the simulator state that determines the dynamic behavior of the circuit over a finite time period.

If Tn is 0, the simulation will remain in QUIESCENT_DOMAIN, and the analog solver will solve for a DC solution. When the analog solver determines that Tn>0 and there is no more A/D events in DC, it schedules a transition on DOMAIN to TIME_DOMAIN. (Tn may be equal to Tc (a delta cycle). In a delta cycle, signal values and shared variables may have changed. As a result, the analog solution may be affected, even with no change in time. In this case, a BREAK statement is expected, or the simulation is in the first delta cycle at Tc=0).

If the process is in the TIME_DOMAIN, the BREAK flag is cleared, 504. If a BREAK occurs prior to the time domain being reached, the subsequent QUIESCENT domain delta cycles will include the analog solution.

If there are A/D events at Ta, 505, then Tn is updated to be the minimum of Ta or Tn, min{Ta, Tn}, 506. When there is an A/D event at Ta and it is earlier than Tn, the analog solver will return Ta as the new next event time of Tn.

Tc is set to Tn, 507. After the analog solver has advanced continuous time, the discrete clock is moved to the next discrete activity. Signals are updated, 508. The signal values are updated by events occurring at the current time. The simulation time is checked to determine whether the simulation has completed, 509. If completion conditions are met, the simulation ends here.

Processes sensitive to signals with events and processes scheduled at Tc, 510, are resumed. Both non-postponed and postponed processes can be resumed. They are put in a set of processes for which execution is pending but have not been run yet. The events may include timeouts from wait statements. Resumed non-postponed processes are executed in order to schedule events (delta or delayed) in digital event queue; schedule D/A events at Tc; and execute BREAK statements in VHDL by setting the BREAK flag, for example.

Tn is updated, 511. Tn is set to the earliest scheduled digital event, or to infinity if there is no future digital event. This sets the time of the next discrete activity. If there are D/A events, 512, or the BREAK flag is set at Tc, 514, then Ta=Tc, 513, 515. This implies rejecting the analog speculative solution at Ta if Ta>Tc.

If postponed process are resumed, 516, then Tn=Tc, 517. If the DOMAIN=QUIESCENT_DOMAIN, 518, the process returns to 501. This is performed to skip postponed processes in the QUIESCENT_DOMAIN. For example, when the analog solver determines that Tn is greater than 0, it schedules a transition on DOMAIN to TIME_DOMAIN. The next cycle will be in TIME_DOMAIN at time 0, and will execute postponed processes if there are no delta events. This reflects the impact of VHDL during the simulation cycle. The behavior of VHDL modules during this part of the cycle is therefore: If DOMAIN=TIME_DOMAIN or Tn=0.0, then 518 is skipped; the driver of DOMAIN is assigned TIME_DOMAIN after 0 ns, and Tn is set to 0.0. This function is activated one time when the simulation transitions from QUIESCENT_DOMAIN (DC analysis) to TIME_DOMAIN (transient analysis). If the simulation is in the QUIESCENT_DOMAIN and no delta events are pending, a delta event is scheduled on the DOMAIN signal and Tn is reset to 0 for the delta cycle.

If Ta is equal to Tc, 519, the process returns to 501. This can happen in two cases: At Tc=0, the analog solver is run at the end of the delta cycles but before postponed processes are executed; and when there is a D/A event at Tc but no BREAK flag been set, the analog solver is run.

If Tn>Tc, then: Execute resumed postponed processes, 520, and recalculate Tn. This may be performed when no delta events are pending, that is, the next discrete activity is in the future. At that time, postponed processes can run. They are the last execution at any point in time, and may be prohibited from scheduling delta events.

These processes may be performed by a computer processing system, including a computer readable memory, a processor, a bus, an input/output device, and other computer components and digital devices. The simulation programs may be written in instructions of a computer programming language and stored on a computer readable medium. A processing system may read the program stored in the memory, and execute the instructions to perform the simulation methods.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

What is claimed is:

1. A computer-implemented method of simulating a mixed language electronic circuit design comprising:

representing a first portion of a mixed language analog mixed signal (AMS) circuit design in a first language;

representing a second portion of the mixed language AMS circuit design in a second language;

executing by a processor a simulation of the mixed language AMS circuit design using the first and second language representations in a single simulator during a single simulation cycle, wherein the simulation comprises a simulation process that synchronizes the first and second language representations during the single simulation cycle, wherein statements executed during the single simulation cycle by the first language are synchronized with the statements executed by the second language; and storing the simulation results of the first or second portions in a computer readable medium or displaying the simulation results of the first or second portions on an output device.

2. The method of claim 1, wherein the first language is Verilog-AMS and the second language is VHDL-AMS.

3. The method of claim 1, wherein executing the simulation cycle comprises:

synchronizing analog and digital events from the first language representation with analog and digital events from the second language representation during the simulation cycle.

4. The method of claim 3, wherein synchronizing comprises:

processing a first set of digital events during a first delta cycle at a current simulation time of the simulation cycle;

processing a second set of digital events during a second delta cycle at the current simulation time; and processing a set of digital to analog events between the first and second delta cycles.

5. The method of claim 4, wherein processing a digital to analog event between the first and second delta cycles comprises:

determining that a VHDL break statement has executed during the first delta cycle; and determining an analog solution incorporating the set of digital to analog events before processing the second delta cycle.

6. The method of claim 5, further comprising:

processing postponed processes after determining a last analog solution at current simulation time.

7. The method of claim 1, further comprising:

determining a speculative analog solution at a future simulation time.

8. The method of claim 7, further comprising:

rejecting the speculative solution when a digital to analog event occurs at a simulation time earlier than the future simulation time of the speculative solution.

9. The method of claim 1, further comprising:

initializing simulation elements of first language representation of the mixed language AMS circuit design with simulation elements of second language representation of the mixed language AMS circuit design.

10. The method of claim 9, wherein initializing further comprises:

setting an implicit break flag to set the time of the first simulation cycle to zero.

11. A computer readable medium storing a program of computer instructions which, when executed by a processing system comprising a processor, cause the system to perform a computer-implemented method of simulating a mixed language electronic circuit design, the method comprising:

representing a first portion of a mixed language analog mixed signal (AMS) circuit design in a first language;

representing a second portion of the AMS circuit design in a second language; and executing a simulation of the mixed language AMS circuit design using the first and second language representations in a single simulator during a single simulation cycle, wherein the simulation comprises a simulation process that synchronizes the first and second language representations during the single simulation cycle, wherein statements executed during the single simulation cycle by the first language are synchronized with the statements executed by the second language; and storing the simulation results of the first or second portions or displaying the simulation results of the first or second portions on an output device.

12. The computer readable medium of claim 11, wherein the first language is Verilog-AMS and the second language is VHDL-AMS.

13. The computer readable medium of claim 11, wherein the program comprises instructions, which, when executed, cause the system to perform executing the simulation cycle by performing the method comprising:

synchronizing analog and digital events from the first language representation with analog and digital events from the second language representation during the simulation cycle.

14. The computer readable medium of claim 13, wherein the program comprises instructions, which, when executed, cause the system to perform synchronizing by performing the method comprising:

processing a first set of digital events during a first delta cycle at a current simulation time of the simulation cycle;

processing a second set of digital events during a second delta cycle at the current simulation time; and processing a set of digital to analog events between the first and second delta cycles.

15. The computer readable medium of claim 14, wherein the program comprises instructions, which, when executed, cause the system to perform processing a digital to analog event between the first and second delta cycles by performing the method comprising:

determining that a VHDL break statement has executed during the first delta cycle; and determining an analog solution incorporating the set of digital to analog events before processing the second delta cycle.

16. The computer readable medium of claim 15, wherein the program comprises instructions, which, when executed, cause the system to perform the method further comprising:

processing postponed processes after determining a last analog solution at current simulation time.

17. The computer readable medium of claim 11, wherein the program comprises instructions, which, when executed, cause the system to perform the method further comprising:

determining a speculative analog solution at a future simulation time.

18. The computer readable medium of claim 17, wherein the program comprises instructions, which, when executed, cause the system to perform the method further comprising:

rejecting the speculative solution when a digital to analog event occurs at a simulation time earlier than the future simulation time of the speculative solution.

19. The computer readable medium of claim 11, wherein the program comprises instructions, which, when executed, cause the system to perform the method further comprising:
    initializing simulation elements of first language representation of the mixed language AMS circuit design with simulation elements of second language representation of the mixed language AMS circuit design.

20. The method of claim 19, wherein the program comprises instructions, which, when executed, cause the system to perform initializing by performing the method comprising:
    setting an implicit break flag to set the time of the first simulation cycle to zero.

21. An apparatus for simulating a mixed language electronic circuit design comprising:
    means for representing a first portion of a mixed language analog mixed signal (AMS) circuit design in a first language;
    means for representing a second portion of the mixed language AMS circuit design in a second language; and
    a processor for executing a simulation of the mixed language AMS circuit design using the first and second language representations in a single simulator during a single simulation cycle, wherein the simulation comprises a simulation process that synchronizes the first and second language representations during the single simulation cycle, wherein statements executed during the single simulation cycle by the first language are synchronized with the statements executed by the second language; and
    a computer readable medium for storing the simulation results of the first or second portions or an output device for displaying the simulation results of the first or second portions.

22. The apparatus of claim 21, wherein the first language is Verilog-AMS and the second language is VHDL-AMS.

23. The apparatus of claim 21, wherein said means for executing the simulation cycle comprises:
    means for synchronizing analog and digital events from the first language representation with analog and digital events from the second language representation during the simulation cycle.

24. The apparatus of claim 23, wherein said means for synchronizing comprises:
    means for processing a first set of digital events during a first delta cycle at a current simulation time of the simulation cycle;
    means for processing a second set of digital events during a second delta cycle at the current simulation time; and
    means for processing a set of digital to analog events between the first and second delta cycles.

25. The apparatus of claim 24, wherein said means for processing a digital to analog event between the first and second delta cycles comprises:
    means for determining that a VHDL break statement has executed during the first delta cycle; and
    means for determining an analog solution incorporating the set of digital to analog events before processing the second delta cycle.

26. The apparatus of claim 25, further comprising:
    means for processing postponed processes after determining a last analog solution at current simulation time.

27. The apparatus of claim 21, further comprising:
    means for determining a speculative analog solution at a future simulation time.

28. The apparatus of claim 27, further comprising:
    means for rejecting the speculative solution when a digital to analog event occurs at a simulation time earlier than the future simulation time of the speculative solution.

29. The apparatus of claim 21, further comprising:
    means for initializing simulation elements of first language representation of the mixed language AMS circuit design with simulation elements of second language representation of the mixed language AMS circuit design.

30. The apparatus of claim 29, wherein said means for initializing further comprises:
    means for setting an implicit break flag to set the time of the first simulation cycle to zero.

* * * * *

UNITED STATES PATENT AND TRADEMARK OFFICE
CERTIFICATE OF CORRECTION

PATENT NO. : 7,599,821 B1
APPLICATION NO. : 10/836575
DATED : October 6, 2009
INVENTOR(S) : Hou et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 349 days.

Signed and Sealed this

Twenty-eighth Day of September, 2010

David J. Kappos
*Director of the United States Patent and Trademark Office*